United States Patent
Pu et al.

(10) Patent No.: US 11,805,694 B1
(45) Date of Patent: Oct. 31, 2023

(54) VIEWING ANGLE ADJUSTING DISPLAY STRUCTURE AND DISPLAY DEVICE

(71) Applicant: HKC CORPORATION LIMITED, Shenzhen (CN)

(72) Inventors: Yang Pu, Shenzhen (CN); Baohong Kang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/330,351

(22) Filed: Jun. 6, 2023

(30) Foreign Application Priority Data

Oct. 11, 2022 (CN) .......................... 202211243228.4

(51) Int. Cl.
*H10K 59/80* (2023.01)
*H10K 59/123* (2023.01)

(52) U.S. Cl.
CPC ....... *H10K 59/8792* (2023.02); *H10K 59/123* (2023.02)

(58) Field of Classification Search
CPC .......................... H10K 59/8792; H10K 59/123
See application file for complete search history.

(56) References Cited

U.S. PATENT DOCUMENTS

2014/0374716 A1* 12/2014 Kim ....................... H10K 59/50
257/40
2015/0236082 A1* 8/2015 Wang ................... H10K 59/124
438/23
2021/0074778 A1* 3/2021 Li ........................ G02F 1/16756

FOREIGN PATENT DOCUMENTS

| CN | 104241327 | 12/2014 |
| CN | 110571257 | 12/2019 |
| CN | 110794628 | 2/2020 |
| CN | 112701147 | 4/2021 |

OTHER PUBLICATIONS

CNIPA, First Office Action for CN Application No. 202211243228. 4, dated Nov. 22, 2022.
CNIPA, Notification to Grant Patent Right for Invention for CN Application No. 202211243228.4, dated Dec. 5, 2022.

* cited by examiner

*Primary Examiner* — Nduka E Ojeh
(74) *Attorney, Agent, or Firm* — Hodgson Russ LLP

(57) ABSTRACT

A display structure comprises pixel areas. At least one side of each of the pixel areas is provided with a viewing angle adjustment area. Each of the pixel areas is provided with light emitting part for emitting light, the viewing angle adjusting part includes a light shielding part and an adjusting electrode. The light shielding part has a narrow viewing angle position for shielding light from light emitting part and a wide viewing angle position for avoiding light from the light emitting part. The adjusting electrode is disposed corresponding to the light shielding part. The adjusting electrode forms an electric field, to drive the light shielding part is driven by the electric to move between the narrow viewing angle position and the wide viewing angle position.

20 Claims, 4 Drawing Sheets

VIEWING ANGLE ADJUSTING DISPLAY STRUCTURE AND DISPLAY DEVICE

CROSS-REFERENCE TO RELATED APPLICATIONS

This application claims priority to Chinese Patent Application No. 202211243228.4, filed Oct. 11, 2022, the entire contents of which are incorporated herein by reference.

TECHNICAL FIELD

The present disclosure relates to the field of display technology, and more particularly, to a display structure and a display device.

BACKGROUND

At present, many terminal devices are equipped with monitors, which can display the contents intuitively. When being used by users, these terminal devices may be applied to different use environments. For example, when users view private information, it is not desired for the users that people around them see, but when they share content, it is desirable to make it possible to be seen by more people. However, the current display lacks effective means to switch the viewing angle, which leads to the inconvenience for users to use.

SUMMARY

There are provided a display structure and a display device according to embodiments of this disclosure, The technical solution is as below:

According to one aspect of the present disclosure, the present disclosure provides a display structure provided with pixel areas arranged in an array. Each of the pixel areas is provided with a light emitting part for emitting light. At least one side of each of the pixel areas is provided with a viewing angle adjustment area, the viewing angle adjustment area being provided with a viewing angle adjusting part. The viewing angle adjusting part comprises a light shielding part with a narrow viewing angle position and a wide viewing angle position, An adjusting electrode is disposed corresponding to the light shielding part and configured to form an electric field, the light shielding part is driven by the electric field to move between the narrow viewing angle position and the wide viewing angle position.

The light shielding part is black electrophoretic particles, the adjusting electrode comprises a first electrode plate and a second electrode plate, wherein the first electrode plate and the second electrode plate are disposed opposite each other, and wherein the black electrophoretic particles are disposed between the first electrode plate and the second electrode plate.

The viewing angle adjustment area is provided with a groove, wherein the groove has a first inner side wall and a second inner side wall oppositely disposed, wherein the first electrode plate is disposed at the first inner side wall of the groove, and the second electrode plate is disposed at the second inner side wall of the groove.

The first electrode plate and the second electrode plate are horizontally disposed, a horizontal electric field is formed between the first electrode plate and the second electrode plate, and the horizontal electric field drives the black electrophoretic particles to move in a horizontal direction.

According to another aspect of the present disclosure, the present disclosure further provides a display device comprising a display panel provided with a display area and a non-display area disposed at a periphery of the display area. The display device further comprises the display structure as described above, and the display structure is disposed in the display area.

It should be understood that the above general description and the following detailed description are exemplary only and are not intended to limit the present disclosure.

BRIEF DESCRIPTION OF THE DRAWINGS

The above and other objects features and advantages of the present disclosure will become more apparent by describing exemplary embodiments thereof in detail with reference to the accompanying drawings.

DESCRIPTION OF THE EMBODIMENTS

Figure 1:
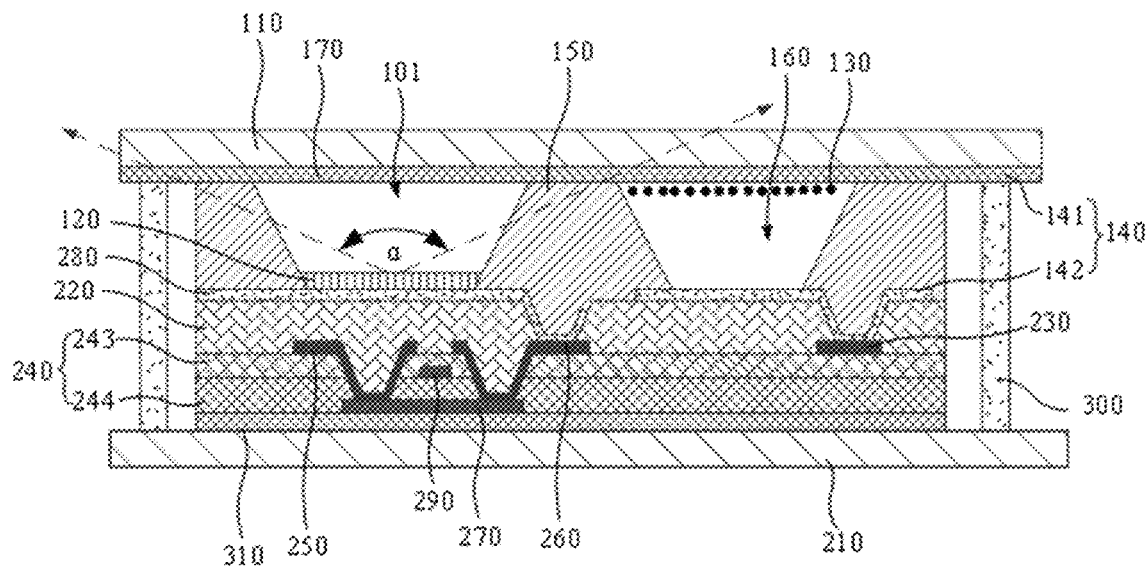
FIG. 1 is a structural schematic view of a light shielding part of a display structure in a narrow viewing angle position according to a first embodiment of the present disclosure.

Although the present disclosure can readily be embodied in different forms of embodiment, however, only some of the specific embodiments are shown in the drawings and will be described in detail in the description, while it is understood that the description is to be regarded as an exemplary illustration of the principles of the present disclosure and is not intended to limit the present disclosure to those described herein.

Thus, one feature pointed out in the description is intended to illustrate one of the features of one embodiment of the present disclosure and is not intended to imply that each embodiment of the present disclosure must have the illustrated feature. In addition, it should be noted that many features are described in the description. Although certain features may be combined to illustrate a possible system design, these features may also be used for other unspecified combinations. Therefore, unless otherwise stated, the illustrated combinations are not intended to be limiting.

In the embodiments illustrated in the drawings, indications of direction (such as up, down, left, right, front and back) are used to explain that the structure and movement of the various elements of the present disclosure are not absolute but relative. These descriptions are appropriate when these elements are in the positions shown in the drawings. If the description of the positions of the elements changes, the indications of the directions change accordingly.

The exemplary embodiments will now be described more fully with reference to the accompanying drawings. However, the example embodiments can be implemented in a variety of forms and should not be construed as being limited to the examples set forth herein. Rather, these embodiments are provided so that the present disclosure will be more comprehensive and complete, and the concept of example embodiments will be fully communicated to those skilled in the art. The accompanying drawings are only schematic illustrations of the present disclosure and are not necessarily drawn to scale. Like reference numerals in the figures denote identical or similar parts and thus repetitive descriptions thereof will be omitted.

The embodiments of the present disclosure are further elaborated below in conjunction with the accompanying drawings of the description.

Embodiment 1

Figure 2:
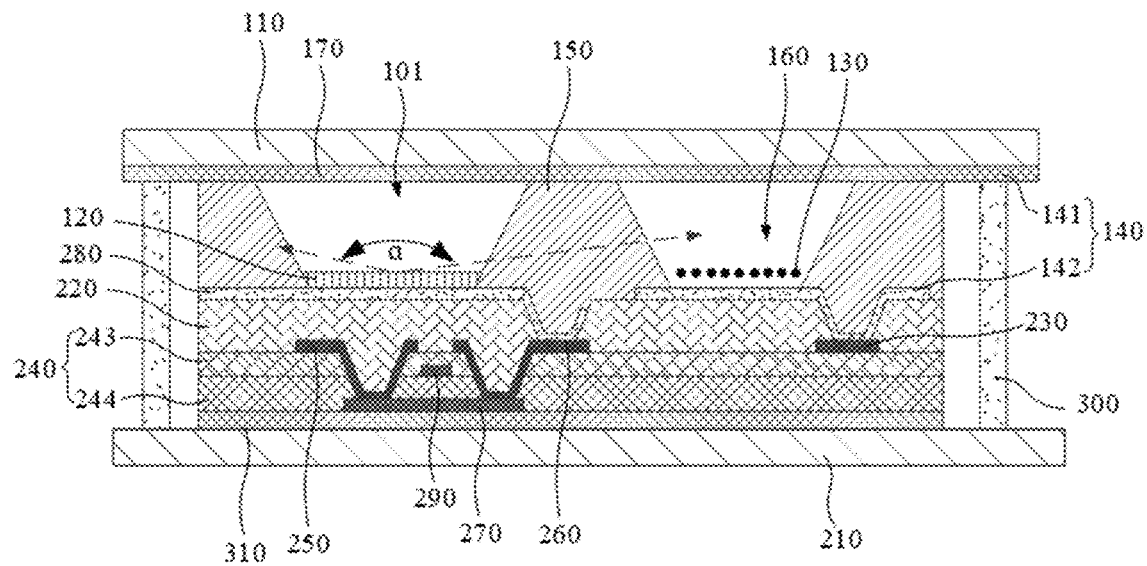
FIG. 2 is a structural schematic view of a light shielding part of a display structure in a wide viewing angle position according to a first embodiment of the present disclosure.

Referring to FIG. 1 and FIG. 2, the present disclosure provides a display structure which can be applied to an LCD (Liquid Crystal Display) display, an LED (Light Emitting Diode) display, or an OLED (Organic Light-Emitting Diode) display.

The display structure has pixel areas 101 arranged in an array. At least one side of each of the pixel area 101 is provided with a viewing angle adjustment area 160. The pixel area 101 is provided with a light emitting part for emitting light, and the viewing angle adjustment area 160 is provided with a viewing angle adjusting part. The light emitting part is configured to emit light to complete the normal display of the picture. The light emitting part can be LCD, LED or OLED.

One light emitting part corresponds to one pixel area 101. The number of pixel areas 101 is usually representative of the resolution of the display structure. Generally, the pixel areas 101 are arranged in a matrix of rows and columns. The light emitted by the light emitting part forms a field of view α, which can be understood as a horizontal angle of view or a vertical angle of view. The size of the field of view determines the user's field of vision. The larger the field of view, the larger the field of vision, and the smaller the field of view, the smaller the field of vision.

The viewing angle adjusting part includes a light shielding part and an adjusting electrode, the light shielding part 130 is opaque or reflects light, and the light from the light emitting part cannot pass through when encountering the light shielding part 130.

The light shielding part has a narrow viewing angle position and a wide viewing angle position, the position where the light shielding part shields the light of the light emitting part is a narrow viewing angle position, and the position where the light shielding part avoids the light of the light emitting part is a wide viewing angle position. In some case, the avoidance can also be understood that there is no light shielded by the light shielding part, or the wide viewing angle position has more light that is not shielded by the light shielding part than the narrow viewing angle position. The adjusting electrode is arranged corresponding to the light shielding part, the adjusting electrode forms an electric field, and the electric field drives the light shielding part to move between the narrow viewing angle position and the wide viewing angle position.

The light shielding part 130 is charged, and the adjusting electrode 140 is provided corresponding to the light shielding part 130. The electric field of the adjusting electrode 140 drives the light shielding part 130 to move and shields or avoids the light from the light emitting part. The position with the most shielding light is the narrow viewing angle position, and the position with the least shielding light or the position without shielding light is the wide viewing angle position. The light shielding part 130 moves between the narrow viewing angle position and the wide viewing angle position under the action of the electric field so that the field of view α is adjusted.

In the technical solution of the present disclosure, the adjusting electrode 140 forms an electric field, the electric field acts on the light shielding part 130, and the light shielding part 130 moves under the action of the electric field. A part of the light emitted by the light emitting part 130 can be shielded by the movement of the light shielding part, so that the user's observation field of view becomes narrower, and the position where the light shielding part 130 is at this time is the narrow viewing angle position. The movement of the light shielding part can also avoid the light emitted by the light emitting part 130, at this time, the user's observation field of view becomes wider, and the position where the light shielding part 130 is at this time is the wide viewing angle position. Therefore, according to the technical solution, driven by the adjusting electrode 140, the light shielding part 130 can move between the narrow viewing angle position and the wide viewing angle position so that the size of field of view can be switched according to the user's requirement, which improves the convenience of use by the user.

In this embodiment, it should be emphasized that the embodiment makes full use of the position between each adjacent pixel area 101 and the pixel area 101. A privacy film does not need to be arranged in the thickness direction, making the display structure thinner. The flat design of the display structure is facilitated, and the terminal equipment can be thinner.

Further, the viewing angle adjustment area 160 is disposed around the pixel area 101. As can be seen from this, the light shielding part 130 is also provided at the periphery of the pixel area 101. In this way, when adjusting the field of view, light can be shielded or not be shielded at the periphery of the pixel area 101, and the angle range for adjusting the field of view can be increased.

Figure 3:
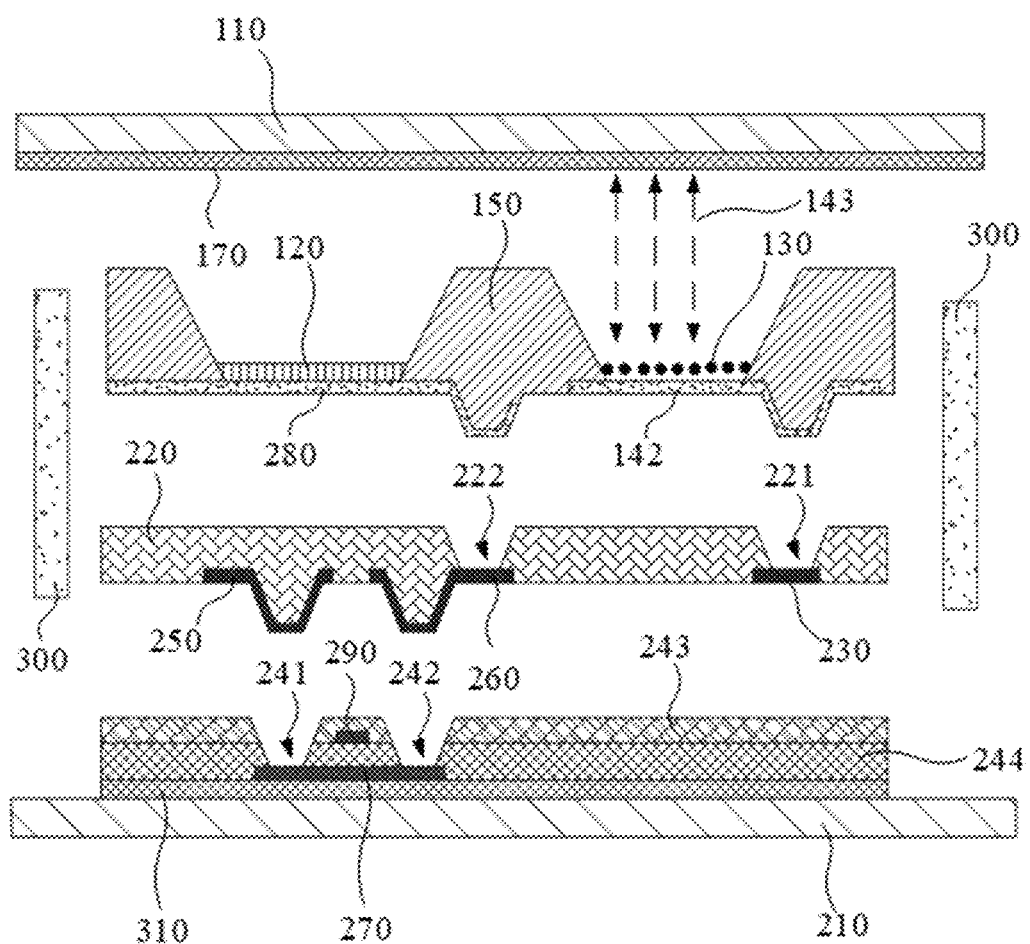
FIG. 3 is an exploded structural view of the display structure in FIG. 2 of the present disclosure.

Referring to FIG. 3, the display structure includes a pixel design layer 150 (PDL layer for short) in order to effectively complete the adjustment of the field of view. The pixel design layer 150 is arranged around the pixel area 101. The pixel design layer 150 is provided with a groove, which forms a viewing angle adjustment area 160, and the light shielding part 130 is arranged in the groove. Since the pixel design layer 150 has the function of transmitting light, the light generated by the light emitting part can pass through the pixel design layer 150. With the arrangement of the grooves, the space of the pixel design layer 150 is fully utilized.

In addition, the pixel design layer 150 is enclosed to form an enclosed space to protect the light emitting part and reduce the entry of outside air or water vapor into the enclosed space, so as to reduce the erosion of the light emitting part.

In order to more effectively realize the adjustment of the field of view, the light shielding part 130 is black electrophoretic particles, and the adjusting electrode 140 includes a first electrode plate 141 and a second electrode plate 142, the first electrode plate 141 and the second electrode plate 142 are opposite each other, and the black electrophoretic particles are arranged between the first electrode plate 141 and the second electrode plate 142. Thus, the first electrode plate 141 and the second electrode plate 142 are provided on opposite sides of the black electrophoretic particles. An electric field is generated between the first electrode plate 141 and the second electrode plate 142 and black electrophoretic particles move between the first electrode plate 141 and the second electrode plate 142. Black electrophoretic particles are opaque and charged particles, which are injected into the groove by inkjet printing.

Further, the display structure includes a first transparent substrate 110, a second transparent substrate 210 and a flat layer 220. The first transparent substrate 110 and the second transparent substrate 210 are disposed opposite to each other. The flat layer 220 is disposed between the second transparent substrate 210 and the first transparent substrate 110. The first electrode plate 141 is disposed on a side of the first transparent substrate 110 facing the flat layer 220, and the second electrode plate 142 is disposed on a side of the flat layer 220 facing the first transparent substrate 110. A vertical electric field 143 is formed between the first electrode plate 141 and the second electrode plate 142, and the vertical electric field 143 drives the black electrophoretic particles to move in a direction perpendicular to the surface of the first transparent substrate 110.

That is, a direction of the electric field formed between the first electrode plate 141 and the second electrode plate 142 is perpendicular to the surface of the first transparent substrate 110. When the narrow viewing angle is required, the black electrophoretic particles move toward the first electrode plate 141 so that light from the light emitting part irradiates the black electrophoretic particles and the light is blocked by the black electrophoretic particles. When the wide viewing angle is required, the black electrophoretic particles move toward the second electrode plate 142, and the light from the light emitting part can pass through the pixel design layer, the first electrode plate 141, and the first transparent substrate 110 in turn, so that the light is not blocked and a wide viewing angle is realized. The first electrode plate 141 is a transparent conductive layer.

The electric fields with different electric field strength can be formed between the first electrode plate 141 and the second electrode plate 142 by adjusting the voltage magnitude of the two, and the black electrophoretic particles can move to different positions between the first electrode plate 141 and the second electrode plate 142 under the action of different electric fields. At different positions, the shading angle is also different, which can flexibly adjust the size of the field of view.

In order to make the display structure have a larger adjustment range of the field of view, the depth of the groove is usually equal to the height of the pixel design layer, so that the black electrophoretic particles has a larger moving range, and thus the field of view can be adjusted in a larger range. By adjusting the range of the field of view, the adjustment range can be increased to 30° to 45° on the basis of the original field of view.

The first transparent substrate 110 may be a glass substrate or a plastic substrate. Likewise, the second transparent substrate 210 may be a glass substrate or a plastic substrate. A stable spatial structure is formed between the first transparent substrate 110 and the second transparent substrate 210 to protect devices between them. The flat layer 220 has good stability, and a flat surface can be formed by the flat layer 220 which facilitates the setting of the pixel design layer.

The pixel design layer is disposed between the flat layer 220 and the first transparent substrate 110, and the second electrode plate 142 is disposed on a side of the flat layer 220 facing the first transparent substrate 110. Further, the pixel design layer is disposed between the first transparent substrate 110 and the flat layer 220 to form a closed enclosed space in which the light emitting part may be disposed. Interference of external environment to the light emitting part is reduced.

In order to provide the viewing angle adjustment signal to the adjusting electrode 140 conveniently, the display structure further includes a transfer electrode 230. The transfer electrode 230 is arranged between the flat layer 220 and the second transparent substrate 210. The flat layer 220 is provided with a first through hole 221, which is arranged corresponding to the transfer electrode 230. The second electrode plate 142 partially extends along the first through hole 221 and is connected to the transfer electrode 230, and the transfer electrode 230 is configured to receive the viewing angle adjustment signal. After the transfer electrode 230 receives the viewing angle adjustment signal, the transfer electrode 230 transmits the signal to the second electrode plate 142, and the second electrode plate 142 forms an electric field of different magnitudes between the first electrode plate 141 and the second electrode plate 142 according to the voltage of the viewing angle adjustment signal.

For example, if the voltage of the viewing angle adjustment signal is less than the voltage on the first electrode plate 141, the voltage on the second electrode plate 142 is also less than the voltage on the first electrode plate 141. The direction of the electric field points from the first electrode plate 141 to the second electrode plate 142, and the black electrophoretic particles are moved from the first electrode plate 141 to the second electrode plate 142 to achieve a wide viewing angle. If the voltage of the viewing angle adjustment signal is larger than the voltage on the first electrode plate 141, the voltage on the second electrode plate 142 is also larger than the voltage on the first electrode plate 141. The direction of the electric field points from the second electrode plate 142 to the first electrode plate 141, and the black electrophoretic particles are moved from the second electrode plate 142 to the first electrode plate 141 to achieve a narrow viewing angle. Generally speaking, the voltage magnitude on the first electrode plate 141 is constant, and the direction of the electric field is changed by changing the voltage magnitude of the viewing angle adjustment signal, so that the black electrophoretic particles can block or avoid light rays.

In one aspect, the light emitting part includes a thin film transistor, a pixel electrode 280, a light emitting layer 120, and a common electrode 170. The thin film transistor, a flat layer 220, the pixel electrode 280, the light emitting layer 120, and the common electrode 170 are arranged in sequence from the second transparent substrate 210 to the first transparent substrate 110. The source 250 and drain 260 of the thin film transistor are arranged in the same layer as the transfer electrode 230, and the pixel electrode 280 is connected to the source 250 or drain 260 of the thin film transistor. The thin film transistor includes a source 250, a drain 260, a gate 290 and a semiconductor layer 270.

Specifically, the display structure further includes an insulating layer 240. The insulating layer 240 is disposed between the flat layer 220 and the second transparent substrate 210. The insulating layer 240 also includes a first insulating layer 243 and a second insulating layer 244. The gate 290 is disposed between the first insulating layer 243 and the second insulating layer 244, and the first insulating layer 243 is disposed between the gate 290 and the flat layer 220. The materials of the first insulating layer 243 and the second insulating layer 244 may be the same or different. For example, the material of the first insulating layer 243 is a mixture of silicon nitride and silicon oxide, and the material of the second insulating layer 244 is silicon oxide.

The source 250 and the drain 260 are each disposed between the insulating layer 240 and the flat layer 220, and the source 250, the drain 260 and the transfer electrode 230 are disposed in the same layer. The source 250 and the drain 260 are disposed between the first insulating layer 243 and the flat layer 220. The source 250, the drain 260 and the transfer electrode 230 are disposed on the same layer, which can simplify the process flow, and the source 250, the drain 260 and the transfer electrode 230 can be arranged through the same printing, mask and etching process.

Further, the semiconductor layer 270 is disposed between the second transparent substrate 210 and the insulating layer 240, and the insulating layer 240 is provided with a second through hole 241 and a third through hole 242, and both of the second through hole 241 and the third through hole 242 are disposed corresponding to the semiconductor layer 270. The second through hole 241 and the third through hole 242 each pass through the first insulating layer 243 and the second insulating layer 244 in sequence. The source 250 partially extends along the second through hole 241 and is connected to the semiconductor layer 270. The drain 260 partially extends along the third through hole 242 and is connected to the semiconductor layer 270. The semiconductor layer 270 supplies power to the source 250 and drain 260, and the source 250 or the drain 260 transmits power to the pixel electrode 280.

The display structure further includes a transition layer 310, and the transition layer 310 is disposed between the second insulating layer 244 and the second transparent substrate 210. The transition layer 310 ensures that the semiconductor layer 270 is more securely disposed. Generally, the transition layer 310 is a silicon oxide layer.

The common electrode 170 is provided on a side of the first transparent substrate 110 facing the flat layer 220, and the pixel electrode 280 is provided on a side of the flat layer 220 facing the first transparent substrate 110. The common electrode 170 and the pixel electrode 280 form an electric field to cause the light emitting layer 120 to emit light. The flat layer 220 is provided with a fourth through hole 222, which is provided corresponding to the source 250 or the drain 260, and the pixel electrode 280 partially extends along the fourth through hole 222 and is connected to the source 250 or the drain 260. The pixel electrode 280 may be connected to the source 250 or the drain 260. When an electric field is formed between the common electrode 170 and the pixel electrode 280, an electric signal is transmitted to the source 250 or the drain 260 through the semiconductor layer 270, and then transmitted to the pixel electrode 280 through the source 250 or the drain 260, thereby forming an electric field between the common electrode 170 and the pixel electrode 280 and driving the light emitting layer 120 to be lightened.

To simplify the fabrication process, the common electrode 170 and the first electrode plate 141 are arranged in the same layer, and the pixel electrode 280 and the second electrode plate 142 are arranged in the same layer. That is, the common electrode 170 and the first electrode plate 141 can be completed by the same printing, masking and etching process. Generally, the common electrode 170 and the first electrode plate 141 are connected to each other, and the voltages of the common electrode 170 and the first electrode plate 141 are equal. The common electrode 170 is an ITO (Indium tin oxide) conductive layer. The arrangement of the pixel electrode 280 and the second electrode plate 142 can be completed by another printing, masking and etching process. However, the pixel electrode 280 and the second electrode plate 142 are disconnected, thus the voltages supplied by the pixel electrode 280 and the second electrode plate 142 vary in magnitude.

The pixel electrode 280 faces an enclosed space, and the second electrode plate 142 also faces an enclosed space. In order to reduce the possibility of forming a gap in the enclosed space corresponding to the pixel electrode 280 and the second electrode plate 142, the disconnected positions of the pixel electrode 280 and the second electrode plate 142 are located between the pixel design layer 150 and the flat layer 220, such that the disconnected positions of the pixel electrode 280 and the second electrode plate 142 avoid the respective enclosed space, and the disconnected positions are covered by the pixel design layer 150, thus reducing the possibility of forming a gap in the respective enclosed space.

Figure 4:
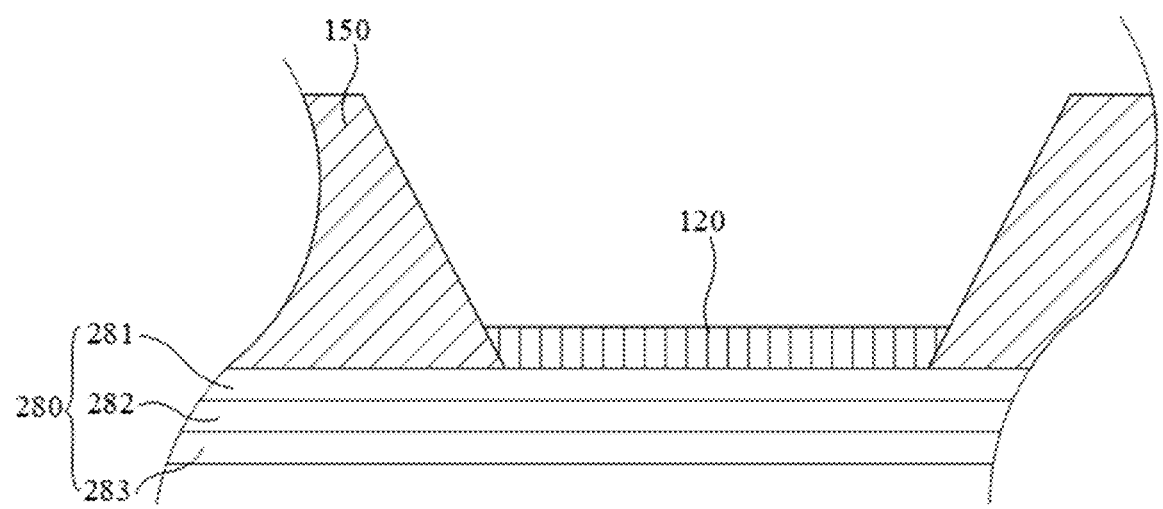
FIG. 4 is a partial structural view of a pixel electrode in FIG. 3 of the present disclosure.

Referring to FIG. 4, the light emitting layer 120 is an organic light emitting layer. The pixel electrode 280 includes a first conductive layer 281, a reflective layer 282 and a second conductive layer 283. The first conductive layer 281, the reflective layer 282 and the second conductive layer 283 are sequentially disposed in a direction away from the light emitting part. The organic light emitting layer is also referred to as an OLED, and the organic light emitting layer emits light at an angle of 360°. In order to make full use of the light emitted by the organic light emitting layer, the light emitted to the pixel electrode 280 is reflected back so that the light is emitted to the first transparent substrate 110. The reflection of light is mainly completed by the reflective layer 282. The first conductive layer 281 may be an ITO conductive layer, the reflective layer 282 may be a silver layer, and the second conductive layer 283 may also be an ITO conductive layer. Thus, light from the organic light emitting layer is reflected to the first transparent substrate 110 by reflection of the silver layer.

In addition, the organic light emitting layer is easily affected by water vapor and air. In order to reduce the influence of water vapor and air, the display structure further includes an encapsulation adhesive 300. The encapsulation adhesive 300 is disposed between the first transparent substrate 110 and the second transparent substrate 210 to form a sealed space between the first transparent substrate 110 and the second transparent substrate 210, thereby reducing the penetration of external water vapor and air into the organic light emitting layer and reducing the influence on the organic light emitting layer.

Figure 5:
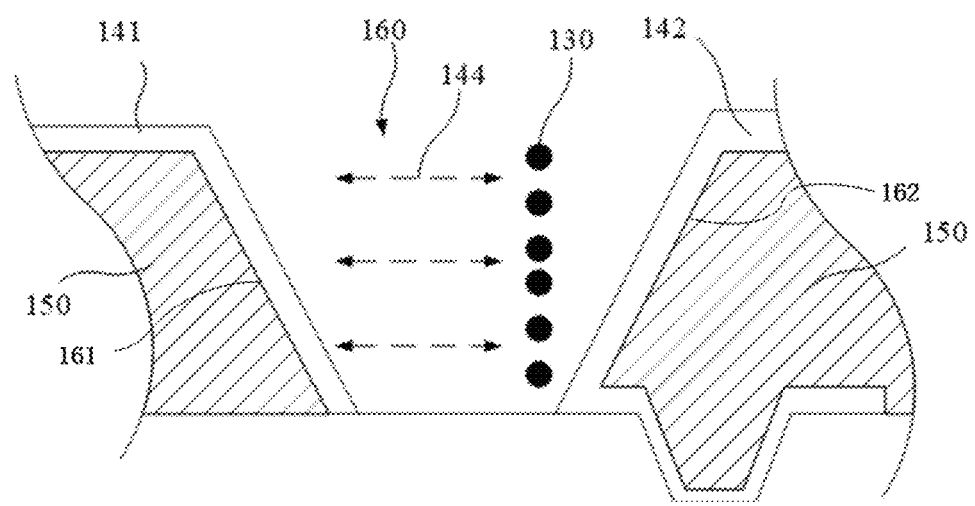
FIG. 5 is a schematic structural view of the adjusting electrode of the display structure disposed at another position according to the present disclosure.

Referring to FIG. 5, the black electrophoretic particles mentioned above are moved in a direction perpendicular to the surface of the first transparent substrate 110, and another mode of movement is provided. Specifically, the first electrode plate 141 and the second electrode plate 142 are horizontally disposed, and the plate surfaces of the first electrode plate 141 and the second electrode plate 142 may be perpendicular to the surface of the first transparent substrate 110. A horizontal electric field 144 is formed between the first electrode plate 141 and the second electrode plate 142, and the horizontal electric field 144 drives the black electrophoretic particles to move in a direction parallel to the surface of the first transparent substrate 110.

For example, the viewing angle adjustment area 160 is provided with a groove. The groove has a first inner side wall 161 and a second inner side wall 162 oppositely disposed. The first electrode plate 141 is disposed at the first inner side wall 161 of the groove, and the second electrode plate 142 is disposed at the second inner side wall 162 of the groove, such that the horizontal electric field 144 is formed between the first electrode plate 141 and the second electrode plate 142, and the horizontal electric field 144 drives the black electrophoretic particles to move in a direction parallel to the surface of the first transparent substrate 110. The first electrode plate 141 may be connected to the common electrode 170, and voltage is supplied to it through the common electrode 170. The second electrode plate 142 may be connected through the flat layer 220 to the transfer electrode 230, and voltage is supplied to the second electrode plate 142 through the transfer electrode 230.

When the wide viewing angle is required, the voltage on the second electrode plate 142 is less than the voltage on the first electrode plate 141. The direction of the electric field points from the first electrode plate 141 to the second electrode plate 142, and the black electrophoretic particles are moved from the first electrode plate 141 to the second electrode plate 142, thereby reducing light shielding of the light emitting part and widening the field of view. When a narrow viewing angle is required, the voltage on the second electrode plate 142 is greater than the voltage on the first electrode plate 141. The direction of the electric field points from the second electrode plate 142 to the first electrode plate 141, and the black electrophoretic particles are moved from the second electrode plate 142 to the first electrode plate 141, thereby increasing the light shielding of the light emitting part and narrowing the field of view.

Embodiment 2

Figure 6:
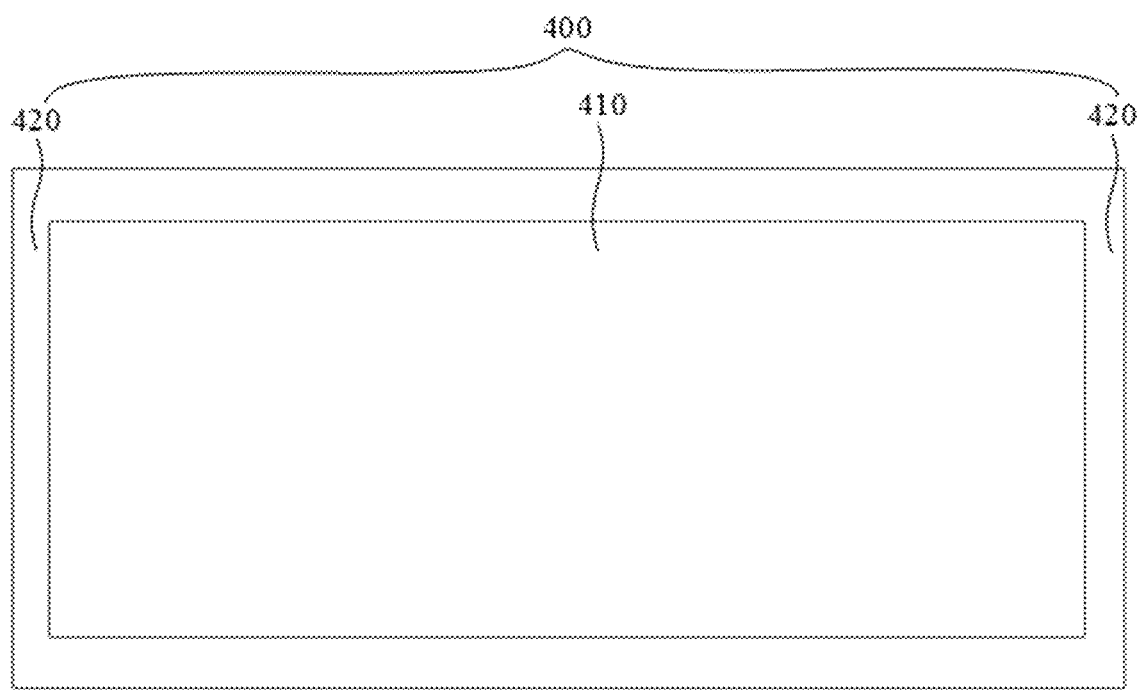
FIG. 6 is a schematic structural view of a display device according to a second embodiment of the present disclosure.

Referring to FIG. 6, the present disclosure also provides a display device, which includes a display panel 400. The display panel 400 has a display area 410 and a non-display area 420. The non-display area 420 is arranged at the periphery of the display area 410, and the display device also includes a display structure arranged at the display area 410.

The display structure includes pixel areas 101. At least one side of each of the pixel area 101 is provided with a viewing angle adjustment area 160. The pixel area 101 is provided with a light emitting part for emitting light, and the viewing angle adjustment area 160 is provided with a viewing angle adjusting part. The light emitting part is configured to emit light to complete the normal display of the picture. The light emitting part can be LCD, LED or OLED.

One light emitting part corresponds to one pixel area 101. The number of pixel areas 101 is usually representative of the resolution of the display structure. Generally, the pixel areas 101 are arranged in a matrix of rows and columns. The light emitted by the light emitting part forms a field of view α, which can be understood as a horizontal angle of view or a vertical angle of view. The size of the field of view determines the user's field of vision. The larger the field of view, the larger the field of vision, and the smaller the field of view, the smaller the field of vision.

The viewing angle adjusting part includes a light shielding part and an adjusting electrode, the light shielding part 130 is opaque or reflects light, and the light from the light emitting part cannot pass through when encountering the light shielding part 130.

The light shielding part has a narrow viewing angle position for shielding light from light emitting part and a wide viewing angle position for avoiding light from the light emitting part. The adjusting electrode is disposed corresponding to the light shielding part. The adjusting electrode forms an electric field to drive the light shielding part to move between the narrow viewing angle position and the wide viewing angle position.

The light shielding part 130 is charged, and the adjusting electrode 140 is provided corresponding to the light shielding part 130. The electric field of the adjusting electrode 140 drives the light shielding part 130 to move and shields or avoids the light from the light emitting part. The position with the most shielded light is the narrow viewing angle position, and the position with the least shielded light or the position without shielded light is the wide viewing angle position. The light shielding part 130 moves between the narrow viewing angle position and the wide viewing angle position under the action of the electric field so that the field of view α is adjusted.

While the present disclosure has been described with reference to several exemplary embodiments, it should be understood that the terms used are illustrative and exemplary and are not limiting. Since the present disclosure can be embodied in various forms without departing from the spirit or essence of the present disclosure, it should therefore be understood that the foregoing embodiments are not limited to any of the foregoing details, but are to be interpreted broadly within the spirit and scope defined by the appended claims, so that all variations and modifications falling within the scope of the claims or their equivalents are to be covered by the appended claims.

What is claimed is:

1. A display structure, comprising:
pixel areas arranged in an array, each of the pixel areas being provided with a light emitting part for emitting light, wherein at least one side of each of the pixel areas is provided with a viewing angle adjustment area, the viewing angle adjustment area being provided with a viewing angle adjusting part;
wherein the viewing angle adjusting part comprises:
a light shielding part with a narrow viewing angle position and a wide viewing angle position; and
an adjusting electrode disposed corresponding to the light shielding part and configured to form an electric field, wherein the light shielding part is driven by the electric field to move between the narrow viewing angle position and the wide viewing angle position;
wherein the light shielding part is black electrophoretic particles, the adjusting electrode comprises a first electrode plate and a second electrode plate, wherein the first electrode plate and the second electrode plate are disposed opposite each other, and wherein the black electrophoretic particles are disposed between the first electrode plate and the second electrode plate;
wherein the viewing angle adjustment area is provided with a groove, wherein the groove has a first inner side wall and a second inner side wall oppositely disposed, wherein the first electrode plate is disposed at the first inner side wall of the groove, and the second electrode plate is disposed at the second inner side wall of the groove;
wherein the first electrode plate and the second electrode plate are horizontally disposed, a horizontal electric field is formed between the first electrode plate and the second electrode plate, and the horizontal electric field drives the black electrophoretic particles to move in a horizontal direction.

2. The display structure according to claim 1, wherein the display structure comprises a first transparent substrate, a second transparent substrate and a flat layer, wherein the first transparent substrate and the second transparent substrate are disposed opposite each other, and the flat layer is disposed between the second transparent substrate and the first transparent substrate.

3. The display structure according to claim 2, wherein the display structure further comprises a transfer electrode interposed between the flat layer and the second transparent substrate, wherein the flat layer is provided with a first through hole disposed corresponding to the transfer electrode, wherein a part of the second electrode plate extends along the first through hole and is connected to the transfer electrode, and the transfer electrode is configured to receive a viewing angle adjustment signal.

4. The display structure according to claim 3, wherein the light emitting part comprises a thin film transistor, a pixel electrode, a light emitting layer and a common electrode, wherein the thin film transistor, the flat layer, the pixel electrode, the light emitting layer and the common electrode are sequentially arranged from the second transparent substrate to the first transparent substrate, wherein a source and a drain of the thin film transistor are arranged in an identical layer as the transfer electrode, and the pixel electrode is connected to the source or drain of the thin film transistor; and wherein the common electrode and the first electrode plate are connected.

5. The display structure according to claim 4, wherein the light emitting layer is an organic light emitting layer, and the pixel electrode comprises a first conductive layer, a reflective layer, and a second conductive layer, wherein the first conductive layer, the reflective layer, and the second conductive layer are sequentially arranged in a direction away from the light emitting part.

6. The display structure according to claim 4, further comprising an insulating layer disposed between the flat layer and the second transparent substrate, wherein the insulating layer comprises a first insulating layer and a second insulating layer, and a gate of the thin film transistor is disposed between the first insulating layer and the second insulating layer, and the first insulating layer is disposed between the gate and the flat layer.

7. The display structure according to claim 2, wherein when a voltage on the second electrode plate is less than a voltage on the first electrode plate, a direction of the electric field points from the first electrode plate to the second electrode plate, and the black electrophoretic particles are moved from the first electrode plate to the second electrode plate to widen a viewing angle.

8. The display structure according to claim 2, wherein when a voltage on the second electrode plate is larger than a voltage on the first electrode plate, a direction of the electric field points from the second electrode plate to the first electrode plate, and the black electrophoretic particles are moved from the second electrode plate to the first electrode plate to narrow a viewing angle.

9. The display structure according to claim 1, wherein the viewing angle adjustment area is arranged around each of the pixel areas.

10. The display structure according to claim 9, wherein the display structure comprises a pixel design layer, the pixel design layer encloses each of the pixel areas and is provided with the groove, the groove forms the viewing angle adjustment area, and the light shielding part is arranged in the groove.

11. The display structure according to claim 10, wherein a depth of the groove is equal to a height of the pixel design layer.

12. A display device comprising:

a display panel provided with a display area and a non-display area disposed at a periphery of the display area, wherein the display device further comprises a display structure is disposed in the display area, wherein the display structure comprises:

pixel areas arranged in an array, each of the pixel areas being provided with a light emitting part for emitting light, wherein at least one side of each of the pixel areas is provided with a viewing angle adjustment area, the viewing angle adjustment area being provided with a viewing angle adjusting part;

wherein the viewing angle adjusting part comprises:

a light shielding part with a narrow viewing angle position and a wide viewing angle position; and an adjusting electrode disposed corresponding to the light shielding part and configured to form an electric field, wherein the light shielding part is driven by the electric field to move between the narrow viewing angle position and the wide viewing angle position;

wherein the light shielding part is black electrophoretic particles, the adjusting electrode comprises a first electrode plate and a second electrode plate, wherein the first electrode plate and the second electrode plate are disposed opposite each other, and wherein the black electrophoretic particles are disposed between the first electrode plate and the second electrode plate;

wherein the viewing angle adjustment area is provided with a groove, wherein the groove has a first inner side wall and a second inner side wall oppositely disposed, wherein the first electrode plate is disposed at the first inner side wall of the groove, and the second electrode plate is disposed at the second inner side wall of the groove;

wherein the first electrode plate and the second electrode plate are horizontally disposed, a horizontal electric field is formed between the first electrode plate and the second electrode plate, and the horizontal electric field drives the black electrophoretic particles to move in a horizontal direction.

13. The display device according to claim 12, wherein the display structure comprises a first transparent substrate, a second transparent substrate and a flat layer, wherein the first transparent substrate and the second transparent substrate are disposed opposite each other, and the flat layer is disposed between the second transparent substrate and the first transparent substrate.

14. The display device according to claim 13, wherein the display structure further comprises a transfer electrode interposed between the flat layer and the second transparent substrate, wherein the flat layer is provided with a first through hole disposed corresponding to the transfer electrode, wherein a part of the second electrode plate extends along the first through hole and is connected to the transfer electrode, and the transfer electrode is configured to receive a viewing angle adjustment signal.

15. The display device according to claim 14, wherein the light emitting part comprises a thin film transistor, a pixel electrode, a light emitting layer and a common electrode, wherein the thin film transistor, the flat layer, the pixel electrode, the light emitting layer and the common electrode are sequentially arranged from the second transparent substrate to the first transparent substrate, wherein a source and a drain of the thin film transistor are arranged in an identical layer as the transfer electrode, and the pixel electrode is connected to the source or drain of the thin film transistor; and wherein the common electrode and the first electrode plate are connected.

16. The display device according to claim 15, wherein the light emitting layer is an organic light emitting layer, and the pixel electrode comprises a first conductive layer, a reflective layer, and a second conductive layer, wherein the first conductive layer, the reflective layer, and the second conductive layer are sequentially arranged in a direction away from the light emitting part.

17. The display device according to claim 15, further comprising an insulating layer disposed between the flat layer and the second transparent substrate, wherein the insulating layer comprises a first insulating layer and a second insulating layer, and a gate of the thin film transistor is disposed between the first insulating layer and the second insulating layer, and the first insulating layer is disposed between the gate and the flat layer.

18. The display device according to claim 12, wherein the viewing angle adjustment area is arranged around each of the pixel areas.

19. The display device according to claim 18, wherein the display structure comprises a pixel design layer, the pixel design layer encloses each of the pixel areas and is provided with the groove, the groove forms the viewing angle adjustment area, and the light shielding part is arranged in the groove.

20. The display device according to claim 19, wherein a depth of the groove is equal to a height of the pixel design layer.

\* \* \* \* \*